(12) United States Patent
Newman et al.

(10) Patent No.: US 7,276,974 B2
(45) Date of Patent: Oct. 2, 2007

(54) METHOD AND APPARATUS FOR PROTECTING RF POWER AMPLIFIERS

(75) Inventors: David A. Newman, Tempe, AZ (US); Benjamin R. Gilsdorf, Phoenix, AZ (US); David S. Peckham, Barrington Hills, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 147 days.

(21) Appl. No.: 11/222,545

(22) Filed: Sep. 8, 2005

(65) Prior Publication Data

US 2007/0052481 A1   Mar. 8, 2007

(51) Int. Cl.
*H02H 7/20* (2006.01)
(52) U.S. Cl. .................................. 330/298; 330/207 P
(58) Field of Classification Search ................ 330/298, 330/207 P, 285, 296, 302
See application file for complete search history.

(56) References Cited

U.S. PATENT DOCUMENTS 4,727,337 A    2/1988  Jason
4,878,034 A *  10/1989  Gross et al. ................ 330/298
5,268,649 A    12/1993  Jones
5,834,978 A *  11/1998  Cho .......................... 330/298
7,075,373 B2 *  7/2006  Briskin et al. ............. 330/298

* cited by examiner

*Primary Examiner*—Henry Choe
(74) *Attorney, Agent, or Firm*—Ingrassia Fisher Lorenz

(57) ABSTRACT

Method and apparatus are provided for protecting radio frequency (RF) power amplifiers. A circuit (10) is provided for limiting a supply current to a first stage (Q3) of the RF power amplifier having a second stage (Q2) coupled to the first stage. The circuit comprises a comparator (14) having first and second inputs and an output, and a switching circuit (12, 20, 22, 24) having an input coupled to the output of the comparator (14) and having an output configured to couple to the first stage (Q3). The first input of the comparator (14) is configured to receive the supply current, and the second input is configured to receive a current supplied to the second stage (Q2). The comparator (14) is configured to compare a ratio of the supply current to the first stage to the current supplied to the second stage (Q2) with a predetermined value. The switching circuit (12, 20, 22, 24) is configured to limit the supply current to the first stage (Q3) when the ratio exceeds the predetermined value.

20 Claims, 2 Drawing Sheets

METHOD AND APPARATUS FOR PROTECTING RF POWER AMPLIFIERS

FIELD OF THE INVENTION

The present invention generally relates to power amplifiers, and more particularly relates to protecting power amplifiers in the event of extreme voltage or current conditions.

BACKGROUND OF THE INVENTION

Radio Frequency (RF) power amplifiers are commonly used in radio transmitters and transceivers to amplify radio signals. For example, a typical RF power amplifier receives signals from an exciter (e.g, a carrier frequency generator), amplifies the signals, and transfers the amplified signals to an antenna or other RF load. Many conventional radio transmitters include automatic control systems that regulate RF output power to prevent amplifier damage. Some examples of potential sources of amplifier damage include antenna load mismatch, excessive supply voltage, and excessive operating temperature. These automatic control systems typically regulate output power during normal operating conditions and protect the RF power amplifier during abnormal operating conditions using negative feedback and threshold conditions. The threshold conditions may be used to sufficiently regulate output power during abnormal operating conditions but tend to overly limit the output power during normal operating conditions.

Alternative techniques have been implemented to prevent amplifier damage. In one example, a current reference circuit is implemented with the RF power amplifier, and the current supplied to the current reference circuit is compared with a current supplied to an output stage of the RF power amplifier. To avoid dissipating a substantially large amount of power in the RF power amplifier, a relatively large ratio of the resistor associated with the output stage to the resistor associated with the current reference circuit may be selected. With this configuration, the current supplied to the current reference circuit depends on the absolute value of the resistor associated therewith. In practice, variations in ambient temperature and process errors may contribute to variations in this absolute value which in turn add error to any current measurements. External resistors (e.g., non-integrated with the RF power amplifier) may be used but can increase device costs and complexity.

Accordingly, a circuit is desired for protecting an RF power amplifier from extreme voltage or current conditions while allowing the RF power amplifier to achieve maximum output power under normal operating conditions. In addition, an RF power amplifier is desired that is protected from extreme voltage or current conditions and achieves maximum output power under normal operating conditions. In addition, a method of protecting RF power amplifiers from extreme voltage or current conditions is desired. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

Figure 1:
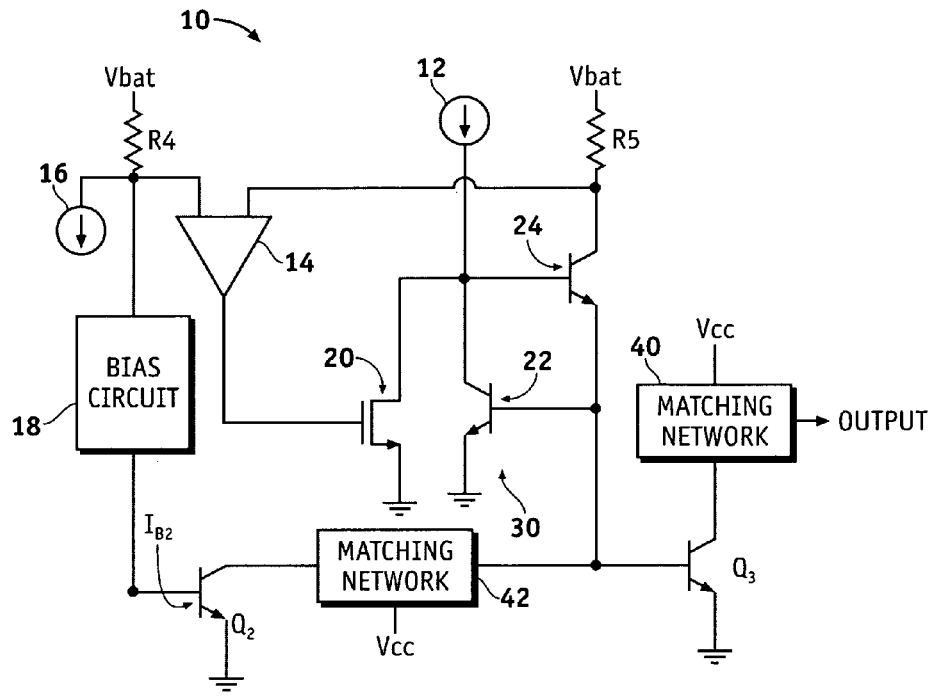
FIG. 1 is a schematic diagram of a portion of an RF power amplifier in accordance with an exemplary embodiment of the present invention.

Referring to the drawings, FIG. 1 is a schematic diagram of a portion of an RF power amplifier 10 in accordance with an exemplary embodiment of the present invention. The RF power amplifier 10 comprises a first stage (Q3) (e.g., an output stage), a second stage (Q2) having an output coupled to first stage (Q3), a first biasing circuit 30 having an input and having a first output coupled to first stage (Q3), a first resistor (R5) having a first terminal configured to receive a reference potential (e.g., $V_{bat}$) and having a second terminal coupled to the input of first biasing circuit 30, a switching transistor 20 having a drain terminal coupled to a second output of biasing circuit 30 and a source terminal coupled to a reference potential (e.g., a ground), a second biasing circuit 18 having an input and having an output coupled to an input of second stage (Q2), a second resistor (R4) having a first terminal configured to receive a reference potential (e.g., $V_{bat}$) and having a second terminal coupled to the input of second biasing circuit 18, and a comparator 14 having a first input coupled to the input of second biasing circuit 18 and the second terminal of second resistor (R4), a second input coupled to the input of first biasing circuit 30 and the second terminal of first resistor (R5), and an output coupled to a gate of switching transistor 20. First resistor (R5) senses the current supplied to first stage (Q3), and second resistor (R4) senses the current supplied to second stage (Q2). The RF power amplifier 10 produces an amplified signal (e.g., based on an input signal) at the output of first stage (Q3).

Additional devices may further be coupled to first stage (Q3) and second stage (Q2), such as an input stage coupled to second stage (Q2). In this exemplary embodiment, first stage (Q3) further comprises a first matching network 40 coupled to a collector of first stage (Q3) and has an input configured to receive a reference potential (e.g., $V_{cc}$) and an output. A second matching network 42 has a first input coupled to a collector of second stage (Q3), a second input configured to receive a reference potential (e.g., $V_{cc}$), and an output coupled to a base of first stage (Q3). Although first stage (Q3) and second stage (Q2) are denoted as third and second stages, respectively, RF power amplifier 10 may have any number of stages. Additionally, any other non-adjacent stage of RF power amplifier 10 may be coupled to comparator 14, and the supply current of such other non-adjacent stage may be compared by comparator 14 with the supply current to first stage (Q3).

In operation, second biasing circuit 18 establishes a voltage for regulating the current supplied to second stage (Q2) and first biasing circuit 30 establishes a voltage for regulating the current supplied to first stage (Q3). First resistor (R5) and second resistor (R4) have pre-determined resistance values and may be selected based on a desired output operating range of RF power amplifier 10. Comparator 14 is an operational amplifier (OPAMP) and compares the current supplied to first stage (Q3) (e.g., the current across first resistor (R5)) with the current supplied to second stage (Q2) (e.g., the current across second resistor (R4)). More particularly, OPAMP 14 compares a first potential, based on the current across first resistor (R5), with a second potential, based on the current across second resistor (R4). When the ratio of the current across first resistor (R5) to the current across second resistor (R4) exceeds the ratio of first resistor (R5) to second resistor (R4), switching transistor 20 limits the current supplied to first stage (Q3), via first biasing circuit 30, and thus prevents damage to RF power amplifier 10 from extreme voltage or current conditions.

In an exemplary embodiment, first biasing circuit 30 comprises a current source 12, and first and second transistors 22, 24 coupled to current source 12. Transistor 22 has a base coupled to first stage (Q3), a collector coupled to current source 12 and the drain terminal of switching transistor 20, and an emitter coupled to a reference potential (e.g., a ground). Transistor 24 has a base coupled to current source 12, the collector of transistor 22, and the drain terminal of switching transistor 20, a collector coupled to the first input of comparator 14 and to the second terminal of first resistor (R5), and an emitter coupled to first stage (Q3) and the base of transistor 22. Current source 12 sets a reference current of biasing circuit 30 to provide a base current to first stage (Q3). When the ratio of the current across first resistor (R5) to second resistor (R4) exceeds the ratio of first resistor (R5) to second resistor (R4), switching transistor 20 draws current from first biasing circuit 30 to limit the base current supplied to first stage (Q3).

To modify the amount of current desired to be sensed across second resistor (R4), an offset current source 16 may optionally be coupled to the input of biasing circuit 18 and the first input of comparator 14. Offset current source 16 may be varied to change the current across second resistor (R4) and thus the potential detected at the first input of comparator 14. In this exemplary embodiment, when the ratio of the current across first resistor (R5) to the current across second resistor (R4) exceeds the ratio of first resistor (R5) to second resistor (R4), where the current across second resistor (R4) is increased by the offset current from offset current source 16, switching transistor 30 limits the current supplied to first stage (Q3).

Figure 2:
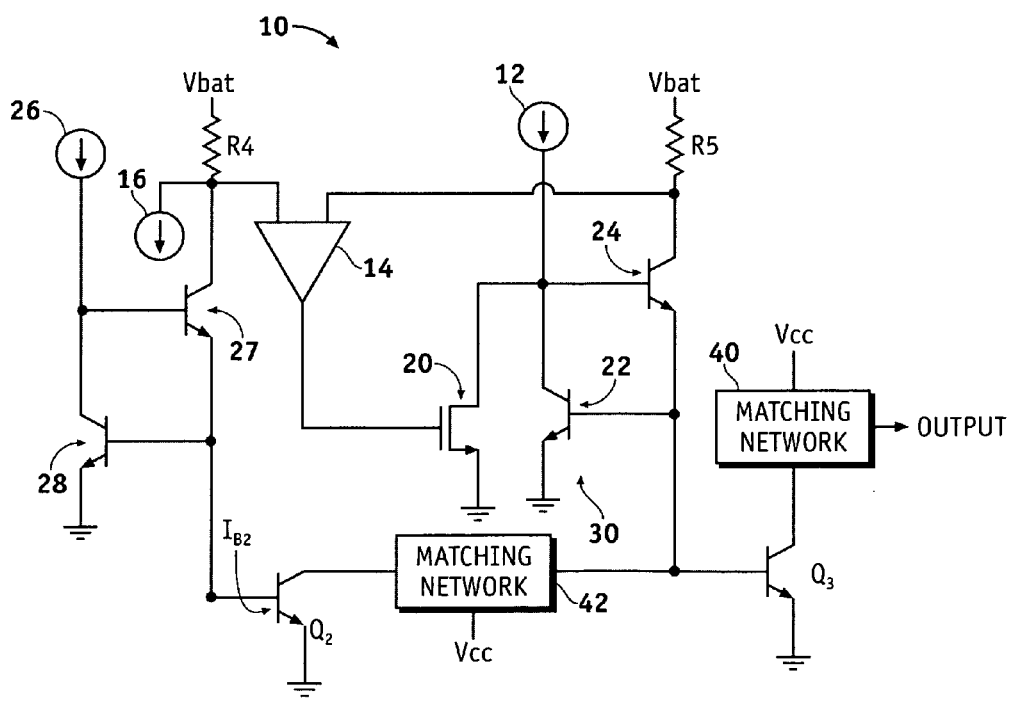
FIG. 2 is a more detailed schematic diagram of the RF power amplifier shown in FIG. 1.

FIG. 2 is a more detailed schematic diagram of the RF power amplifier 10 shown in FIG. 1. Second biasing circuit 18 comprises a current source 26, a first transistor 27 having a base coupled to current source 26 and having a collector coupled to the first input of comparator 14, and a second transistor 28 having a collector coupled to current source 26 and having an emitter configured to couple to a reference potential (e.g., a ground). The emitter of transistor 27 is coupled to the base of transistor 28 and to the input of second stage (Q2). Current source 26 sets a reference current for second biasing circuit 18, and second biasing circuit 18 establishes a voltage for regulating the current supplied to the base of second stage (Q2). The current produced by offset current source 16 may be varied to modify the predetermined value used for comparison by comparator 14.

Figure 3:
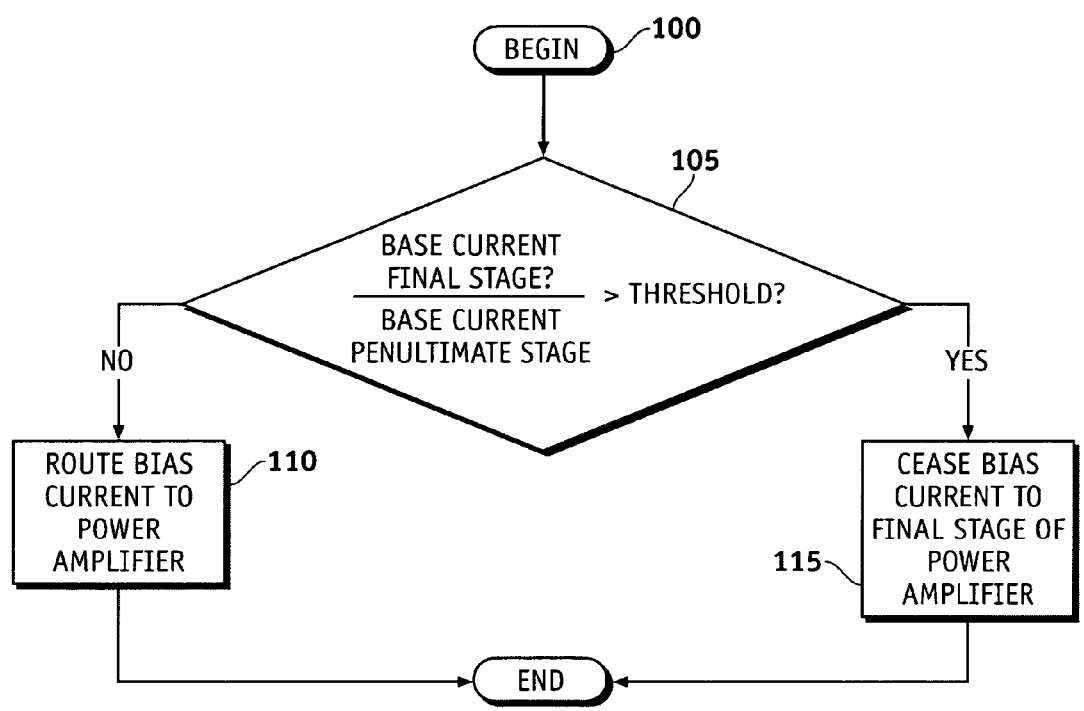
FIG. 3 is a flow diagram of a method for protecting an RF power amplifier in accordance with an exemplary embodiment of the present invention.

Referring to FIGS. 1, 2 and 3, FIG. 3 is a flow diagram for a method of protecting an RF power amplifier in accordance with an exemplary embodiment of the present invention. The method begins at step 100. Comparator 14 compares the base current to first stage (Q3) with the base current to second stage (Q2) with a predetermined value based on the ratio of R5 to R4 at step 105. In an alternative embodiment, when offset current source 16 is used in RF power amplifier 10, the predetermined value is based on the ratio of R5 to R4 and the offset current produced by offset current source 16. The base current of second stage (Q2) is biased by bias circuit 18. In the event the base current to first stage (Q3) does not exceed the base current to second stage (Q2) multiplied by the predetermined value, switching circuit 30 continues to route bias current to first stage (Q3) at step 110. For example, when the base current to first stage (Q3) does not exceed the base current to second stage (Q2), the bias current from current source 12 continues to bias transistor 24 to provide the base current to first stage (Q3). In the event the base current to first stage (Q3) exceeds the base current to second stage (Q2) multiplied by the predetermined value, switching circuit 30 limits the bias current to first stage (Q3) at step 115. For example, when the base current to first stage (Q3) exceeds the base current to second stage (Q2), comparator 14 provides a voltage to the gate of transistor 20 and transistors 20 and 22 draw current from current source 12 thus limiting the base current to first stage (Q3).

In an exemplary embodiment, a circuit is provided for limiting a supply current to a first stage of a Radio Frequency (RF) power amplifier having a second stage coupled to the first stage. The circuit comprises a comparator having first and second inputs and an output, and a switching circuit having an input coupled to the output of the comparator and having an output configured to couple to the first stage. The first input of the comparator is configured to receive the supply current to the first stage, and the second input is configured to receive a current supplied to the second stage. The comparator is configured to compare a ratio of the supply current to the first stage to the current supplied to the second stage with a predetermined value. The switching circuit is configured to limit the supply current to the first stage when the ratio exceeds the predetermined value. The switching circuit comprises first, second, and third transistors and a current source. The first transistor has a gate coupled to the output of the comparator, a drain terminal, and a source terminal coupled to a reference potential. The second transistor has a base coupled to the first stage, a collector coupled to the drain terminal of the first transistor, and an emitter coupled to the reference potential. The third transistor has a base coupled to the drain terminal of the first transistor and the collector of the second transistor, a collector coupled to the first input of the comparator, and an emitter coupled to the first stage and the base of the second transistor. The current source is coupled to the drain terminal of the first transistor, the collector of the second transistor, and the base of the third transistor. The circuit further comprises a biasing circuit having an input coupled to the second input of the comparator and having an output coupled to the second stage. The biasing circuit is configured to regulate the current supplied to the second stage. The circuit further comprises a current source having an input coupled to the input of the biasing circuit and the second input of the comparator. The current source is configured to offset the current supplied to the second stage by a predetermined offset current. The supply current to the first stage is sensed by a first resistance, the current supplied to the second stage is sensed by a second resistance, and the predetermined value comprises a ratio of the first resistance to the second resistance. In another exemplary embodiment, the circuit further comprises a first resistor having a first terminal coupled to the first input of the comparator and having a second terminal configured to couple to a reference potential, and a second resistor having a first terminal coupled to the second input of the comparator and having a second terminal configured to couple to the reference potential.

In another exemplary embodiment, a Radio Frequency (RF) power amplifier is provided comprising a first stage having an input configured to receive a first current and having an output configured to transmit an amplified signal based on the first current, a second stage coupled to the input of the first stage and configured to receive a second current, a comparator circuit having a first input configured to receive a first signal indicating the first current, a second input configured to receive a second signal indicating the second current, and an output coupled to the first stage. The comparator circuit is configured to compare a ratio of the first current to the second current with a predetermined value and limit the first current when the ratio exceeds the predetermined value. The comparator circuit comprises an operational amplifier (OPAMP), a switching transistor, and a biasing circuit. The OPAMP has a first input configured to receive a first potential based on the first current, a second input configured to receive a second potential based on the second current, and an output. The switching transistor has a gate coupled to the output of the OPAMP, a drain terminal, and a source terminal configured to couple to a reference potential. The biasing circuit has a first input coupled to the drain terminal of the switching transistor, a second input coupled to the first input of the OPAMP, and an output coupled to the input of first stage. The biasing circuit is configured to regulate the first current to the first stage, and the switching transistor is configured to control the biasing circuit to limit the first current to the first stage when the ratio exceeds the predetermined value. The biasing circuit comprises a current source configured to supply a reference current for regulating the first current to the first stage, and first and second transistors. The first transistor has a base coupled to the first stage, a collector coupled to the drain terminal of the switching transistor and the current source, and an emitter coupled to the reference potential. The second transistor has a base coupled to the drain terminal of the switching transistor, the collector of the first transistor, and the current source, a collector coupled to the first input of the comparator, and an emitter coupled to the input of the first stage and the base of the second transistor. The drain terminal of the first transistor, the collector of the second transistor, and the base of the third transistor are configured to receive a predetermined bias current. The second stage comprises a biasing circuit having an input coupled to the second input of the comparator circuit and having an output, and a first transistor having a base coupled to the output of said biasing circuit and having a collector coupled to the input of the first stage. The biasing circuit comprises a current source configured to supply a reference current for regulating the second current to the second stage, a second transistor, and a third transistor. The second transistor has a base coupled to the first current source, a collector coupled to the second input of the comparator circuit, and an emitter coupled to the collector of the first transistor. The third transistor has a base coupled to the emitter of the second transistor and the base of the first transistor, a collector coupled to the first current source, and an emitter configured to couple to a reference potential. The RF power amplifier further comprises an offset current source having an input coupled to the second input of the comparator circuit and the input of the biasing circuit. The offset current source is configured to output a third current. The RF power amplifier further comprises a first resistance having a first terminal coupled to the first input of the comparator circuit and having a second terminal configured to couple to a reference potential, and a second resistance having a first terminal coupled to the second input of the comparator circuit and having a second terminal configured to couple to the reference potential. The predetermined value comprises a ratio of the first resistance to the second resistance. The second stage comprises a biasing circuit having an input coupled to the second input of the comparator circuit, and an offset current source having an input coupled to the input of the biasing circuit. The offset current source is configured to produce an offset current, and the second current is modified by the offset current.

In another exemplary embodiment, a method is provided for protecting a radio frequency (RF) power amplifier. The method comprises the steps of comparing a ratio of a first current of a first stage in the RF power amplifier to a second current of a second stage in the RF power amplifier, and limiting the first current when the ratio exceeds a predetermined value. The second stage is coupled to the first stage. The method further comprises the step of biasing the second stage with a bias current prior to the determining step. The second current of the second stage is based on the bias current. The biasing step further comprises the step of offsetting the bias current to the second stage by a predetermined current. The method further comprises the steps of sensing the first current to the first stage across a first resistance, and sensing the second current to the second stage across a second resistance. The predetermined value comprises a ratio of the first resistance to the second resistance. In another exemplary embodiment, the method further comprises the step of biasing the first stage with a bias current prior to the determining step, the first current of the first stage based on the bias current. The limiting step comprises diverting at least a portion of the bias current.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A circuit for limiting a supply current to a first stage of a Radio Frequency (RF) power amplifier having a second stage coupled to the first stage, the circuit comprising:

a comparator having first and second inputs and an output, said first input configured to receive the supply current, said second input configured to receive a current supplied to the second stage, said comparator configured to compare a ratio of the supply current to the first stage to said current supplied to the second stage with a predetermined value; and a switching circuit having an input coupled to said output of said comparator and having an output configured to couple to the first stage, said switching circuit configured to limit the supply current to the first stage when said ratio exceeds said predetermined value.

2. A circuit according to claim 1, wherein said switching circuit comprises:
a first transistor having a gate coupled to said output of said comparator, a drain terminal, and a source terminal coupled to a reference potential;
a second transistor having a base coupled to the first stage, a collector coupled to said drain terminal of said first transistor, and an emitter coupled to said reference potential;
a third transistor having a base coupled to said drain terminal of said first transistor and said collector of said second transistor, a collector coupled to said first input of said comparator, and an emitter coupled to the first stage and said base of said second transistor; and
a current source coupled to said drain terminal of said first transistor, said collector of said second transistor, and said base of said third transistor.

3. A circuit according to claim 1 farther comprising:
a biasing circuit having an input coupled to said second input of said comparator and having an output coupled to the second stage, said biasing circuit configured to regulate said current supplied to the second stage.

4. A circuit according to claim 3 farther comprising a current source having an input coupled to said input of said biasing circuit and said second input of said comparator, said current source configured to offset said current supplied to the second stage by a predetermined offset current.

5. A circuit according to claim 1, wherein the supply current to the first stage is sensed by a first resistance, said current supplied to the second stage is sensed by a second resistance, and said predetermined value comprises a ratio of said first resistance to said second resistance.

6. A circuit according to claim 4 further comprising:
a first resistor having a first terminal coupled to said first input of said comparator and a second terminal configured to couple to a reference potential; and
a second resistor having a first terminal coupled to said second input of said comparator and having a second terminal configured to couple to the reference potential.

7. A Radio Frequency (RF) power amplifier comprising:
a first stage having an input configured to receive a first current and having an output configured to transmit an amplified signal based on said first current;
a second stage coupled to said input of said first stage and configured to receive a second current; and
a comparator circuit having a first input configured to receive a first signal indicating said first current, a second input configured to receive a second signal indicating said second current, and an output coupled to said first stage, said comparator circuit configured to:
compare a ratio of said first current to said second current with a predetermined value; and
limit said first current when said ratio exceeds said predetermined value.

8. An RF power amplifier according to claim 7, wherein said comparator circuit comprises:
an operational amplifier (OPAMP) having a first input configured to receive a first potential based on said first current, a second input configured to receive a second potential based on said second current, and an output;
a switching transistor having a gate coupled to said output of said OPAMP and having a source terminal and a drain terminal; and
a biasing circuit having a first input coupled to said drain terminal of said switching transistor, a second input coupled to said first input of said OPAMP, and an output coupled to said input of said first stage, said biasing circuit configured to regulate said first current to said first stage, said switching transistor configured to control said biasing circuit to limit said first current when said ratio exceeds said predetermined value.

9. An RF power amplifier according to claim 8, wherein said biasing circuit comprises:
a current source configured to supply a reference current for regulating said first current to said first stage;
a first transistor having a base coupled to the first stage, a collector coupled to said drain terminal of said switching transistor and said current source, and an emitter coupled to said reference potential; and
a second transistor having a base coupled to said drain terminal of said switching transistor, said collector of said first transistor, and said current source, a collector coupled to said first input of said comparator, and an emitter coupled to the first stage and said base of said first transistor.

10. An RF power amplifier according to claim 7, wherein said second stage comprises:
a biasing circuit having an input coupled to said second input of said comparator circuit and having an output; and
a first transistor having a base coupled to said output of said biasing circuit and having a collector coupled to said input of said first stage.

11. An RF power amplifier according to claim 10, wherein said biasing circuit comprises:
a current source configured to supply a reference current for regulating said second current to said second stage;
a second transistor having a base coupled to said current source, a collector coupled to said second input of said comparator circuit, and an emitter coupled to said collector of said first transistor; and
a third transistor having a base coupled to said emitter of said second transistor and said base of said first transistor, a collector coupled to said current source, and an emitter configured to couple to a reference potential.

12. An RF power amplifier according to claim 10 further comprising an offset current source having an input coupled to said second input of said comparator circuit and said input of said biasing circuit, said offset current source configured to output a third current.

13. An RF power amplifier according to claim 7 further comprising:
a first resistance having a first terminal coupled to said first input of said comparator circuit and having a second terminal configured to couple to a reference potential; and
a second resistance having a first terminal coupled to said second input of said comparator circuit and having a second terminal configured to couple to said reference potential; and
wherein said predetermined value comprises a ratio of said first resistance to said second resistance.

14. An RF power amplifier according to claim 13, wherein said second stage comprises:
a biasing circuit having an input coupled to said second input of said comparator circuit; and
an offset current source having an input coupled to said input of said biasing circuit, said offset current source configured to produce an offset current; and
wherein said second current is modified by said offset current.

15. A method for protecting a radio frequency (RF) power amplifier, the method comprising the steps of:

comparing a ratio of a first current of a first stage in the RF power amplifier to a second current of a second stage in the RF power amplifier, the second stage coupled to the first stage; and limiting the first current when the ratio exceeds a predetermined value.

16. A method according to claim 15 further comprising the step of biasing the second stage with a bias current prior to said determining step, the second current of the second stage based on the bias current.

17. A method according to claim 15 further comprises the step of offsetting the second current to the second stage by a predetermined current.

18. A method according to claim 15 further comprising the steps of:

sensing the first current to the first stage across a first resistance; and sensing the second current to the second stage across a second resistance; and wherein the predetermined value comprises a ratio of the first resistance to the second resistance.

19. A method according to claim 15 further comprising the step of biasing the first stage with a bias current prior to said determining step, the first current of the first stage based on the bias current.

20. A method according to claim 19, wherein said limiting step comprises diverting at least a portion of the bias current.

* * * * *